(12) United States Patent
Rouaissia et al.

(10) Patent No.: US 10,345,963 B2
(45) Date of Patent: *Jul. 9, 2019

(54) METHOD AND DEVICE FOR REDUCING RADIO FREQUENCY INTERFERENCE OF PROXIMITY AND TOUCH DETECTION IN MOBILE DEVICES

(71) Applicant: Semtech Corporation, Camarillo, CA (US)

(72) Inventors: Chaouki Rouaissia, Neuchatel (CH); Eric Pierre Claude Vandel, Concise (CH)

(73) Assignee: Semtech Corporation, Camarillo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/818,065

(22) Filed: Nov. 20, 2017

(65) Prior Publication Data

US 2018/0088739 A1 Mar. 29, 2018

Related U.S. Application Data

(63) Continuation of application No. 14/530,156, filed on Oct. 31, 2014, now Pat. No. 9,864,464.

(51) Int. Cl.
*G09G 5/00* (2006.01)
*G06F 3/041* (2006.01)
(Continued)

(52) U.S. Cl.
CPC ............ *G06F 3/0418* (2013.01); *G06F 3/044* (2013.01); *H01Q 1/243* (2013.01); *H01Q 1/44* (2013.01);
(Continued)

(58) Field of Classification Search
CPC .......... H01Q 1/243; H01Q 1/44; G06F 3/044; G06F 2203/04103; G06F 2203/04107; H03K 17/955; H03K 2217/960775
(Continued)

(56) References Cited

U.S. PATENT DOCUMENTS 8,872,706 B2 10/2014 Caballero et al.
9,151,792 B1 10/2015 Kremin et al.
(Continued)

FOREIGN PATENT DOCUMENTS

DE 102011004622 A1 8/2012
EP 2276109 A1 1/2011
WO 2014166780 A1 10/2014

OTHER PUBLICATIONS

Analog Devices, Inc., "24-Bit Capacitance-to-Digital Converter with Temperature Sensor", pp. 1-28, 2007.
(Continued)

*Primary Examiner* — Jennifer T Nguyen
(74) *Attorney, Agent, or Firm* — Brian M. Kaufman; Robert D. Atkins; Patent Law Group: Atkins and Associates, P.C.

(57) ABSTRACT

A proximity sensor has a sensing node. A radio frequency signal is received at the sensing node. The radio frequency signal is coupled to an intermediate node through a first capacitor. The radio frequency signal is coupled from the intermediate node to a ground node through a second capacitor. An RF amplifier is coupled to the sensing node. The radio frequency signal is generated using the RF amplifier. A third capacitor is coupled between the RF amplifier and the sensing node. An antenna is coupled to the sensing node. The radio frequency signal is transmitted using the antenna. A capacitance of the antenna is measured using the proximity sensor. The capacitance of the antenna is compared to a threshold to determine proximity of a conductive
(Continued)

object. An inductor is coupled between the sensing node and the antenna. A shielding area is coupled to the intermediate node.

15 Claims, 11 Drawing Sheets

(51) Int. Cl.
  *G06F 3/044* (2006.01)
  *H01Q 1/24* (2006.01)
  *H01Q 1/44* (2006.01)
  *H03K 17/955* (2006.01)

(52) U.S. Cl.
  CPC . *H03K 17/955* (2013.01); *G06F 2203/04103* (2013.01); *G06F 2203/04107* (2013.01); *G06F 2203/04108* (2013.01); *H03K 2217/960765* (2013.01); *H03K 2217/960775* (2013.01)

(58) Field of Classification Search
  USPC .......................................... 345/174; 455/272
  See application file for complete search history.

(56) References Cited

U.S. PATENT DOCUMENTS

| | | |
|---|---|---|
| 9,203,463 B2 | 12/2015 | Asrani et al. |
| 9,478,870 B2 | 10/2016 | Desclos et al. |
| 2012/0112767 A1 | 5/2012 | Nonogaki |
| 2012/0329524 A1 | 12/2012 | Kent et al. |
| 2013/0029625 A1 | 1/2013 | Park et al. |
| 2013/0120052 A1 | 5/2013 | Siska |
| 2013/0120310 A1* | 5/2013 | Siska ................... H03K 17/962 345/174 |
| 2013/0241796 A1 | 9/2013 | Nagumo |
| 2014/0155000 A1 | 6/2014 | Erkens |
| 2015/0022403 A1 | 1/2015 | Lin |
| 2015/0200447 A1* | 7/2015 | Tang ..................... H01Q 1/243 343/720 |
| 2015/0248177 A1 | 9/2015 | Maharyta |
| 2018/0131077 A1* | 5/2018 | Kang ...................... H01Q 9/26 |

OTHER PUBLICATIONS

Cypress Semiconductor, "PSoC 4 Capsense Design Guide", pp. 1-101, Apr. 19, 2013.
Semtech Corporation, "Wireless & Sensing", pp. 1-39, Feb. 5, 2014.

* cited by examiner

METHOD AND DEVICE FOR REDUCING RADIO FREQUENCY INTERFERENCE OF PROXIMITY AND TOUCH DETECTION IN MOBILE DEVICES

CLAIM TO DOMESTIC PRIORITY

The present application is a continuation of U.S. patent application Ser. No. 14/530,156, now U.S. Pat. No. 9,864,464, filed Oct. 31, 2014, which application is incorporated herein by reference.

FIELD OF THE INVENTION

The present invention relates in general to sensors and, more particularly, to a method and device for reducing radio frequency interference of proximity and touch detection in mobile devices.

BACKGROUND OF THE INVENTION

Smartphones and other mobile devices have rapidly become ubiquitous throughout the world. Mobile phones and tablet computers are commonly seen in use at restaurants, in waiting rooms, or on street corners. Mobile devices are used for gaming, photography, listening to music, social networking, or simply talking with another person via a built in microphone and speaker.

Mobile devices enrich lives by keeping family and friends in communication, allowing any moment to be captured as a photo or video, and providing a means of contacting someone in an emergency situation. At the same time, mobile devices pose certain dangers to users. Accidents occur when a driver is distracted by an incoming text message or ongoing phone call. Pedestrians are injured or killed due to paying closer attention to a mobile device than to nearby traffic. In addition, the potential exists that radiation emanating from a mobile device will be absorbed by a human body and cause damage to the health of a user.

FIG. 1a illustrates a mobile device 10. Mobile device 10 is a touchscreen slate cellular (cell) phone. In other embodiments, mobile device 10 is a tablet computer, pager, GPS receiver, smartwatch or other wearable computer, laptop computer, handheld game console, or any other device capable of radio communication.

Mobile device 10 includes touchscreen 12 on a front side of the mobile device. Touchscreen 12 is used to display a graphical user interface (GUI). The GUI on touchscreen 12 presents feedback, notifications, and other information to a user as determined by an operating system of mobile device 10. Touchscreen 12 is sensitive to physical touch from body parts of a user of mobile device 10. Touchscreen 12 utilizes resistance, capacitance, acoustic waves, an infrared grid, optical imaging, or other methods to determine the presence and location of a user's touch.

In one common usage scenario of mobile device 10, touchscreen 12 displays a button as a part of the GUI, and a user touches the location of the button on the touchscreen to perform an action associated with the button. In one embodiment, touchscreen 12 displays a 3×4 telephone keypad. A user dials a telephone number on the displayed keypad by touching touchscreen 12 at the locations where the desired numbers to dial are displayed. Touchscreen 12 displays a keyboard including buttons for alphabetical, numeric, and punctuation characters, along with, or as an alternative to, the telephone keypad, with a user touching the touchscreen in the location of letters, numbers, or symbols to be entered in a text input field displayed on the touchscreen. Touchscreen 12 is also used to watch downloaded or streamed videos, or play games, with a user's touch controlling playback of the video or play of the game. In some embodiments, touchscreen 12 is sensitive to a user's touch when the display component of the touchscreen is disabled. While listening to music, a user pauses the music, or advances to the next track of music, by drawing a symbol on touchscreen 12 even though nothing is displayed on the touchscreen.

Buttons 14 provide an alternative user input mechanism to touchscreen 12. Buttons 14 perform functionality depending on the programming of the operating system running on mobile device 10. In one embodiment, buttons 14 return the GUI on touchscreen 12 to a home screen, go back to a previous GUI screen, or open up a menu on the GUI. In other embodiments, the functionality of buttons 14 changes based on a context displayed on touchscreen 12.

Speaker 16 provides audible feedback to a user of mobile device 10. When mobile device 10 receives an incoming message, speaker 16 produces an audible notification sound to alert a user to the received message. An incoming telephone call causes a ringing sound from speaker 16 to alert the user. In other embodiments, a musical ringtone, selectable via the GUI on touchscreen 12, is played via speaker 16 when an incoming telephone call is received. When mobile device 10 is used to participate in a telephone call, a user of the mobile device speaks into microphone 17 while the other conversation participants' voices are reproduced by speaker 16. When a user watches a movie or plays a game, the sound associated with the movie or game is produced by speaker 16 for the user to hear.

Front facing camera 18 provides visual feedback to the operating system of mobile device 10. Camera 18 creates a digital image of the area facing touchscreen 12. Camera 18 is used in video chat applications running on mobile device 10 to capture video of a user's face during a conversation. Mobile device 10 transmits the video of a user to another person in a remote location and receives a streaming video of the other person which is displayed on touchscreen 12. Camera 18 is also used to take selfies or other pictures. When camera 18 is used to take pictures, touchscreen 12 displays the image being captured by the camera so that the touchscreen is an electronic viewfinder. Captured photographs are stored on memory within mobile device 10 for subsequent viewing on touchscreen 12, sharing on social networks, or backing up to a personal computer.

Housing 20 provides structural support and protection for the internal components of mobile device 10. Housing 20 is made of rigid plastic or metallic materials to withstand environmental hazards which cause harm to the circuit boards and other components within mobile device 10 if exposed directly. In one embodiment, a panel of housing 20 opposite touchscreen 12 is removable to expose interchangeable parts of mobile device 10 such as a subscriber identification module (SIM) card, flash memory card, or battery. Housing 20 includes a transparent glass or plastic portion over touchscreen 12, which protects the touchscreen from environmental factors while allowing a user's touch to be sensed through the housing.

FIG. 1b illustrates a user 30 operating mobile device 10 as a telephone. A portion of housing 20 is removed to illustrate antenna 32 within mobile device 10. User 30 holds mobile device 10 with speaker 16 over an ear of the user. Microphone 17 is oriented toward a mouth of user 30. When user 30 speaks, microphone 17 detects and digitizes the user's voice for transmission to a person the user is speaking with. The person that user 30 is speaking with transmits a digitized voice signal to mobile device 10 which is reproduced on speaker 16 and heard by the user. User 30 thereby converses with another person using mobile device 10.

Mobile device 10 sends a voice signal of user 30, and receives a voice signal of a person being conversed with, using a cellular network or other network capable of voice traffic. In various embodiments, mobile device 10 transmits voice signals and other data over Wi-Fi, Bluetooth, GSM, CDMA, LTE, HSPA+, WiMAX, or other wireless network types. Mobile device 10 transmits a voice signal using radio frequency (RF) electromagnetic waves emanating from RF antenna 32. An RF amplifier in mobile device 10 supplies an electric current, which contains the voice information and oscillates at radio frequencies, to antenna 32. Antenna 32 radiates energy of the current as electromagnetic waves through the surrounding atmosphere. The electromagnetic waves reach a cellular tower which forwards the voice signal on to ultimately be received by the person that user 30 is conversing with.

FIG. 1c is a block diagram of an RF section 33 of mobile device 10. RF section 33 represents a portion of the circuitry located on a circuit board within mobile device 10. RF section 33 includes microcontroller or central processing unit (CPU) 34, RF transceiver 36, RF amplifier 38, and antenna 32. For mobile device 10 to receive an audio signal or other digital data, radio waves are first received by antenna 32. Oscillating electric and magnetic fields of an incoming radio wave exert force on electrons in antenna 32, causing the electrons to oscillate and creating a current in the antenna. RF transceiver 36 demodulates the incoming signal to eliminate RF signals and sends the underlying data to CPU 34.

When mobile device 10 is transmitting data, CPU 34 first provides data to be transmitted. In one embodiment, CPU 34 receives audio data from microphone 17 and performs digital signal processing functions on the audio data. CPU 34 performs any digital signal processing or baseband processing required for the audio data, or a separate digital signal processor (DSP) or baseband integrated circuit (IC) is used. In other embodiments, non-voice data is sent, e.g., an outgoing text message or a uniform resource locator (URL) of a website which user 30 wishes to view on touchscreen 12. Once CPU 34 has received or generated the data to be transmitted, the data is sent from the CPU to RF transceiver 36. RF transceiver 36 generates an RF signal containing the data to be transmitted by modulating the data using the frequency for a network that mobile device 10 is communicating with.

The RF signal is sent from RF transceiver 36 to RF amplifier 38. RF amplifier 38 amplifies the signal from RF transceiver 36 to generate a higher power RF signal for transmission by antenna 32. RF amplifier 38 sends the amplified RF signal to antenna 32. The amplified RF signal causes an oscillating current of electrons within antenna 32. The oscillating electric current creates an oscillating magnetic field around antenna 32 and an oscillating electric field along the antenna. The time-varying electric and magnetic fields radiate away from antenna 32 into the surrounding environment as an RF electromagnetic wave.

The output power of RF amplifier 38 is controlled by CPU 34. CPU 34 controls the strength of an RF signal emanating from antenna 32 by configuring a gain setting of RF amplifier 38. A device receiving radio waves from mobile device 10 can be from a few feet away for in-home Wi-Fi, to a few miles away for rural cellular service, or potentially even further away from the mobile device. A higher gain setting of RF amplifier 38 causes a higher power electromagnetic radio wave to emanate from mobile device 10. A higher power electromagnetic radio wave is received at a location further away from mobile device 10.

Antenna 32 is omnidirectional, i.e., the antenna radiates energy approximately equally in every direction from mobile device 10. An omnidirectional antenna 32 gives mobile device 10 good connectivity with a cellular tower without regard to the angle the mobile device is held at. However, due to the omnidirectional nature of antenna 32, a significant amount of RF electromagnetic radiation from the antenna is radiated into user 30 when the user holds the mobile device near a body part, as illustrated in FIG. 1b. Some health concerns exist in relation to RF radiation from mobile devices, such as mobile device 10, being absorbed by the human body. Some studies suggest that RF energy absorbed by the body of may be linked to cancer and other illnesses.

Specific absorption rate (SAR) is a measure of the rate at which energy is absorbed by the human body when exposed to an RF electromagnetic field. SAR measures exposure to electromagnetic fields between 100 kHz and 10 GHz. A SAR rating is commonly used in association with cell phones and magnetic resonance imaging (MRI) scanners.

When measuring SAR due to mobile device 10, the mobile device is placed at the head in a talk position, as illustrated in FIG. 1b. The SAR value is then measured at the location that has the highest absorption rate in the entire head, which is generally the closest portion of the head to antenna 32. In the United States, the Federal Communications Commission (FCC) requires that mobile devices have a SAR level at or below 1.6 watts per kilogram (W/kg) taken over the volume containing a mass of 1 gram of tissue that is absorbing the most RF energy. In Europe, the European Committee for Electrotechnical Standardization (CENELEC) specifies a SAR limit of 2 W/kg averaged over the 10 grams of tissue absorbing the most RF energy.

Regulations limiting the SAR from mobile device 10 in effect limit the RF power of the mobile device when in use near the body of user 30. Limiting RF output limits signal strength and can harm connectivity of mobile device 10 to cell phone towers. FIGS. 2a-2c show graphs of SAR versus the distance of mobile device 10 from user 30. In FIGS. 2a and 2b, RF amplifier 38 has a constant power output. In FIG. 2a, CPU 34 has configured RF amplifier 38 for high RF power and good connectivity of mobile device 10 to cell phone towers. Line 40 illustrates that with a constant RF power output, SAR is reduced as mobile device 10 is moved further away from user 30, i.e., further right on the graph in FIG. 2a. As mobile device 10 is moved closer to user 30, SAR increases.

Radiation emanating from mobile device 10 attenuates, or reduces in magnitude, as the radiation travels further away from antenna 32. When mobile device 10 is directly next to the head of user 30, much of the radiation emanating from antenna 32 is concentrated on a small area of the head, resulting in a high SAR. When mobile device 10 is further away from user 30, radiation spreads out and hits a larger area of the user's body at a lower energy level. Much of the radiation which hits user 30 when mobile device 10 is held up to the head will miss the user when the mobile device is held at a distance.

Line 40 shows that when configured for high RF power and good connectivity, mobile device 10 will exceed SAR regulatory limit 42 when the mobile device is held within a distance d of a body part of user 30. In one embodiment, the distance d at which mobile device 10 exceeds SAR regulatory limit 42 when configured for high power output is 10 millimeters (mm). Mobile device 10 as configured in FIG. 2a includes good connectivity but is out of compliance with SAR regulations.

One solution to ensure that the SAR of mobile device 10 remains under regulatory limit 42 is to reduce the RF output power of the mobile device, illustrated by FIG. 2b. Line 44 shows that as mobile device 10 is moved further away from user 30, SAR is reduced, as with the configuration of FIG. 2a. However, in FIG. 2b, mobile device 10 is configured for a lower RF output, and does not exceed SAR regulatory limit 42 when the mobile device is held against user 30. The lower RF output makes mobile device 10 in compliance with SAR regulations, but reduces connectivity of the mobile device.

FIG. 2c illustrates another solution to maintaining the SAR of mobile device 10 under regulatory limit 42. When mobile device 10 is held at a distance greater than d from user 30, RF power output of the mobile device, illustrated by line 46, is at a level similar to the higher power setting illustrated in FIG. 2a. When mobile device 10 is moved within a distance d of user 30, i.e., the distance at which SAR would exceed regulatory limit 42 in the configuration of FIG. 2a, the RF output of the mobile device is reduced to remain under the regulatory limit. The reduced RF output within distance d is illustrated by line 48, which is similar to line 44 of FIG. 2b. As configured in FIG. 2c, mobile device 10 includes good connectivity when held a distance greater than d from user 30, and a reduced RF output to remain under SAR regulatory limit 42 when held within a distance d of the user.

To implement the configuration illustrated in FIG. 2c, mobile device 10 includes a proximity sensor used to detect distance from user 30. When the proximity sensor detects user 30 is within a distance d of the proximity sensor, CPU 34 reduces the RF power output of RF amplifier 38 to prevent SAR from rising above regulatory limit 42. When the proximity sensor detects no human body within a distance d of mobile device 10, CPU 34 increases RF power output to improve connectivity.

One goal of mobile device manufactures is to improve the accuracy of proximity sensors. Inaccurate proximity readings result in a high power mode of mobile device 10 being enabled within a distance d of user 30, in violation of SAR regulations. Inaccurate proximity readings also result in a low power mode of mobile device 10 being enabled outside a distance d of user 30, resulting in an unnecessary degradation of connectivity. An accurate proximity sensor provides for an immediate decrease of RF power output when a mobile device is moved within a distance d of a human body, and an immediate increase of RF power output when the mobile device is moved outside of a distance d of the human body.

Achieving accurate proximity readings is difficult when a proximity sensor is near antenna 32 while the antenna is being used for RF transmissions. RF signals used in transmissions over antenna 32 cause interference in capacitive touch sensing because of RF coupling between the antenna and sensing elements of the proximity sensor. Due to the protocols used in RF communication via antenna 32, time multiplexing RF communication and capacitive sensing is difficult. RF communication occurs at the same time as capacitive touch sensing. RF energy from antenna 32 reaches the IC performing the capacitive touch sensing and interferes with an accurate reading of the proximity of a user.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1A:
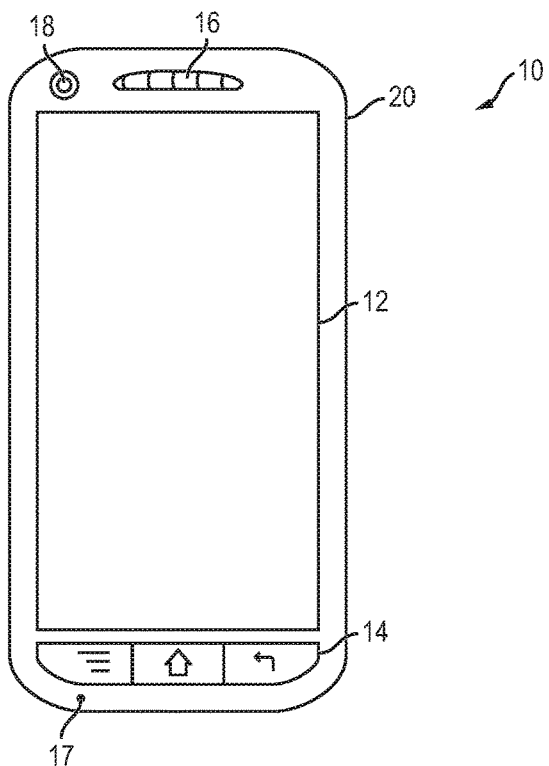
FIGS. 1a-1c illustrate a mobile device with RF transmission capability.
Figure 1B:
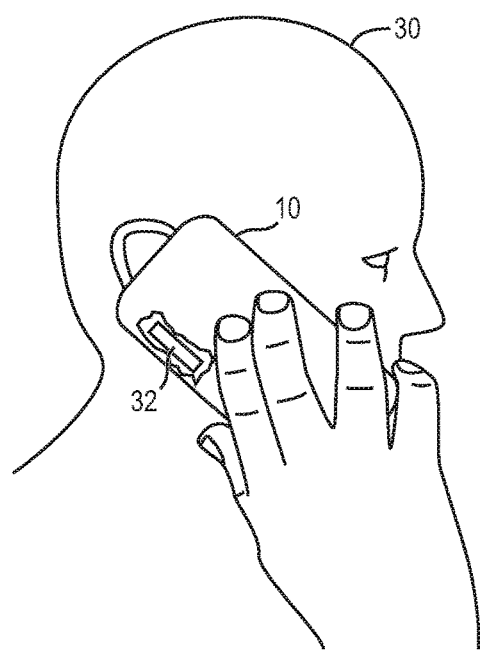
Figure 1C:
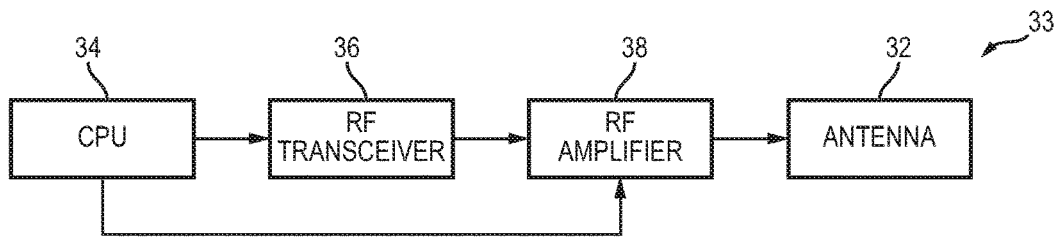
Figure 2A:
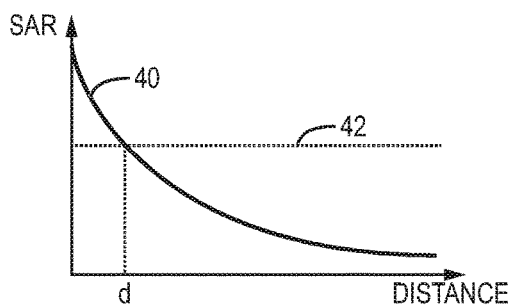
FIGS. 2a-2c illustrate SAR versus distance from a human body for a mobile device with and without the use of a proximity sensor.
Figure 2B:
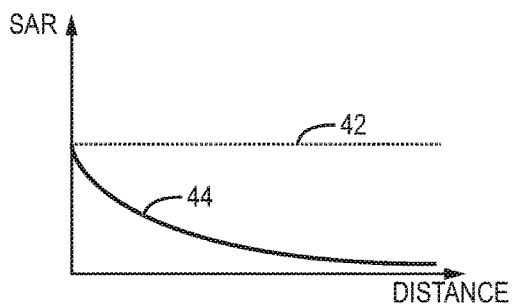
Figure 2C:
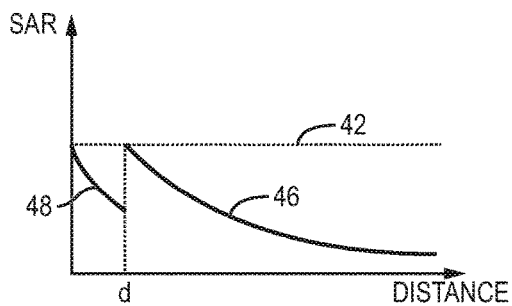
Figure 3A:
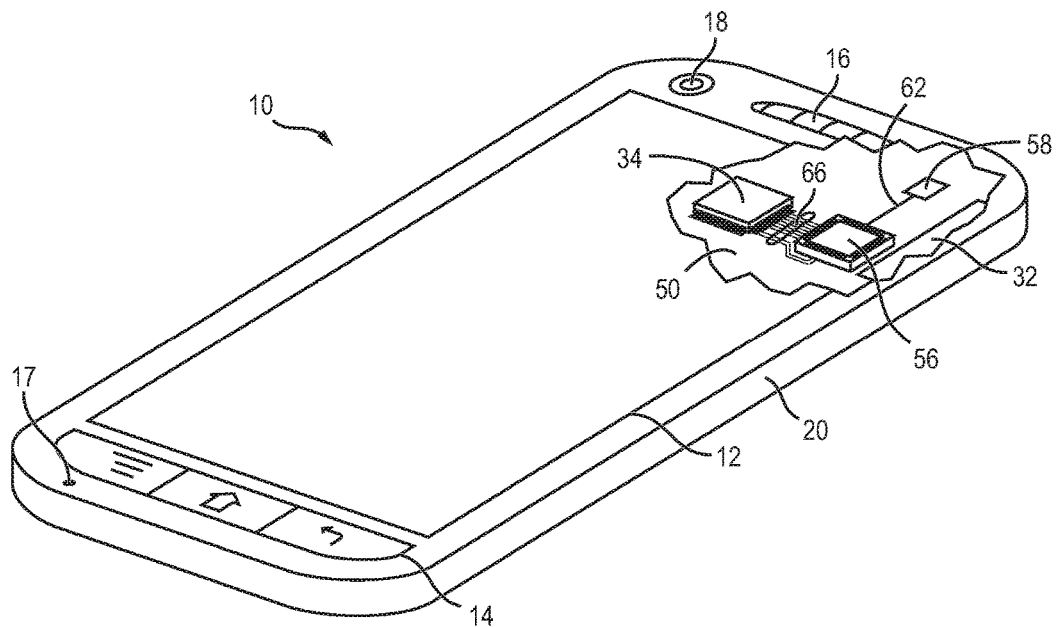
FIGS. 3a-3b illustrate a mobile device including a proximity sensor.

FIG. 3a illustrates mobile device 10 with a portion of touchscreen 12 and housing 20 removed to reveal printed circuit board (PCB) 50 with CPU 34, capacitive touch controller 56, and sensing element 58 formed or disposed on the PCB. In other embodiments, a flexible printed circuit (FPC) is used instead of PCB 50. Capacitive touch controller 56 and sensing element 58 form a proximity sensor for mobile device 10. In some embodiments, proximity sensors are used which do not require a separate sensing element. Conductive trace 62 connects sensing element 58 to capacitive touch controller 56. Conductive traces 66 provide communication between CPU 34 and capacitive touch controller 56.

PCB 50 provides a base for mounting the electronic parts and forming the conductive traces necessary to provide the functionality of mobile device 10. PCB 50 includes other circuit elements and semiconductor packages not illustrated as required to implement the functionality of mobile device 10. PCB 50 includes all the electronic parts necessary for mobile device 10. In other embodiments, the electronic parts for mobile device 10 are split across multiple PCBs. PCB 50 includes additional parts such as a Universal Serial Bus (USB) port, random access memory (RAM), flash memory, a graphics processing unit (GPU), or a system on a chip (SoC).

Capacitive touch controller 56 is an IC designed to measure the self-capacitance, or inherent capacitance, of sensing element 58. Self-capacitance is a capacitance measured between a conductive element, e.g., sensing element 58, and a ground potential. When the conductive object to be detected, e.g., a lap, finger, palm, or face of user 30, is not present near sensing element 58, the self-capacitance of the sensing element, Csensor, is the environmental capacitance, Cenv. Cenv is determined by electric fields from sensing element 58 interacting with the environment near the sensing element. In particular, electric fields from sensing element 58 interact with nearby conductive material such as shielding areas, traces, power and ground planes, conductive vias, and ICs. When a body part of user 30 is present near sensing element 58, the self-capacitance of the sensing element, Csensor, is Cenv plus the capacitance attributable to the body part, Cuser. Capacitive touch controller 56 is calibrated with the value of Cenv, and subtracts Cenv from the total self-capacitance of sensing element 58. The remaining capacitance is the self-capacitance attributable to a body part of user 30 in proximity of sensing element 58, i.e., Cuser. In practice, a configurable capacitor bank within capacitive touch controller 56 cancels or counteracts the Cenv contribution to self-capacitance, leaving Cuser to be measured, although other methods of isolating Cuser from Csensor are used in other embodiments.

If Cuser, i.e., the measured self-capacitance of sensing element 58 attributable to user 30, is approximately equal to zero, capacitive touch controller 56 reports to CPU 34 a lack, or absence, of proximity via a memory mapped flag, as well as an interrupt. If Cuser is over a threshold associated with a human body part, capacitive touch controller 56 reports proximity in a similar manner. In addition to a flag indicating proximity or lack thereof, capacitive touch controller 56 reports to CPU 34 a digital value proportional to Cuser for each Cuser measurement, whether proximity is detected or not. CPU 34 uses the proximity flag for simple applications where only proximity or lack of proximity is needed, and uses the digital Cuser value to implement functionality that is more advanced.

Capacitive touch controller 56 senses self-capacitance of sensing element 58 by first using a bank of capacitors to cancel Cenv, and then converting the remaining capacitance, Cuser, to a proportional voltage potential. In some embodiments, the entire self-capacitance of sensing element 58, Csensor, is converted to a proportional voltage and then reduced by a voltage proportional to Cenv. The resulting voltage, proportional to Cuser, is converted to a digital value using an analog to digital converter. The digital Cuser value is processed to determine whether Cuser exceeds a threshold for acknowledging proximity.

Sensing element 58 is a square of copper formed on a surface of PCB 50, although other shapes and other conductive materials are used for the sensing element in other embodiments. In one embodiment, the same physical element is used for both antenna 32 and sensing element 58. In embodiments with a single physical element used for antenna 32 and sensing element 58, a capacitor and inductor are used to filter RF signals from reaching capacitive touch controller 56 and filter lower frequency signals from reaching RF amplifier 38 and RF transceiver 36. In other embodiments, any conductive element is used for sensing element 58.

Sensing element 58 interacts with nearby conductive material, such as conductive traces, vias, and ground planes, as well as a lap, finger, palm, or face of user 30, via electric fields. When a charge is applied to sensing element 58, an opposite charge is attracted toward the sensing element within any nearby conductive material. When the amount of conductive material near sensing element 58 is increased, a greater amount of electric charge is attracted to the sensing element for a given voltage. Thus, the self-capacitance of sensing element 58 is a function of the amount of conductive material near the sensing element. Conductive material having a conduction path to a circuit node at a ground potential has a greater effect on self-capacitance because the ground node provides a source of additional charge into the conductive material. Sensing element 58 attracts opposite charge into nearby conductive material through the ground node.

Conductive trace 62 connects sensing element 58 to capacitive touch controller 56. In some embodiments, multiple sensing elements are used, with each sensing element separately connected to capacitive touch controller 56 with a different conductive trace. In one embodiment, sensing elements are used to implement buttons 14, with the buttons being activated when proximity of user 30 is sensed on a button. Capacitive touch controller 56 manipulates the voltage of sensing element 58 and detects the self-capacitance of the sensing element via conductive trace 62.

Conductive traces 66 connect CPU 34 to capacitive touch controller 56. Traces 66 include lines for reset, interrupt, data, address, clock, enable, and other signals necessary for communication between CPU 34 and capacitive touch controller 56. In one embodiment, CPU 34 communicates with capacitive touch controller 56 using the inter-integrated circuit ($I^2C$) protocol. Other communication protocols are used in other embodiments.

Some functions of capacitive touch controller 56 are controlled by CPU 34 using a single conductive trace 66 connected to a pin on the capacitive touch controller, such as enabling or disabling sensing. Other functionality is exercised by CPU 34 reading from or writing to hardware registers within capacitive touch controller 56. A raw Cuser value is read from a memory mapped hardware register internal to capacitive touch controller 56. A register is also used by CPU 34 to set the threshold value of Cuser when capacitive touch controller 56 reports proximity. Some functionality is implemented with a discrete input or output pin on capacitive touch controller 56, as well as a hardware register within the capacitive touch controller. Capacitive touch controller 56 is reset by CPU 34 toggling a reset input pin of the capacitive touch controller, or by the CPU writing to a soft reset register within the capacitive touch controller.

Antenna 32 is in close physical proximity to sensing element 58. RF radiation emanating from antenna 32 is received by sensing element 58 and induces an RF signal on trace 62. The RF signal on trace 62 reaches capacitive touch controller 56 and interferes with the capacitive touch controller measuring self-capacitance of sensing element 58. When RF transmissions using antenna 32 occur at the same time as capacitive touch controller 56 makes a capacitance reading, the accuracy of proximity detection is degraded. In other embodiments, where antenna 32 is further away from sensing element 58 within mobile device 10, the strength of RF signals received is reduced, but interference from RF signals received by sensing element 58 remains significant and causes inaccurate proximity readings.

Figure 3B:
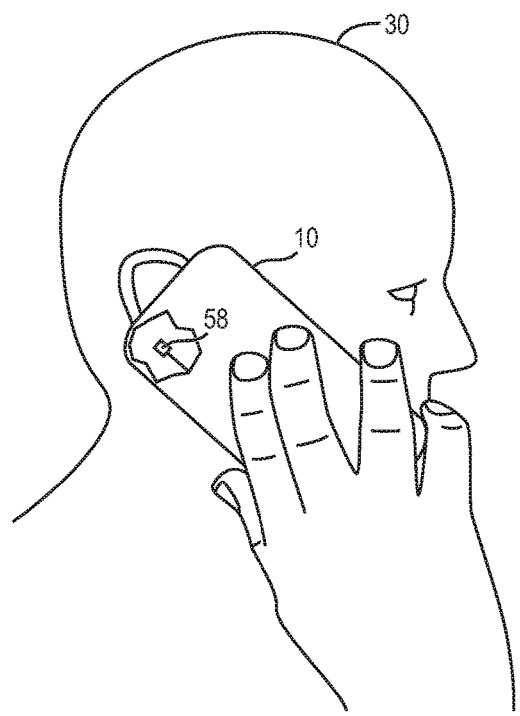

In FIG. 3b, user 30 holds mobile device 10 up to his or her head. The self-capacitance of sensing element 58 increases due to the interaction of electric fields between the sensing element and user 30. Prior to mobile device 10 being disposed in proximity to user 30, the area in front of the mobile device is occupied by air, which has a smaller effect on self-capacitance than the head of the user. Capacitive touch controller 56 detects the rise in self-capacitance of sensing element 58, and notifies CPU 34 of the proximity of user 30. CPU 34 reduces the power output of RF amplifier 38 accordingly so that mobile device 10 remains in compliance with SAR regulations.

Figure 4A:
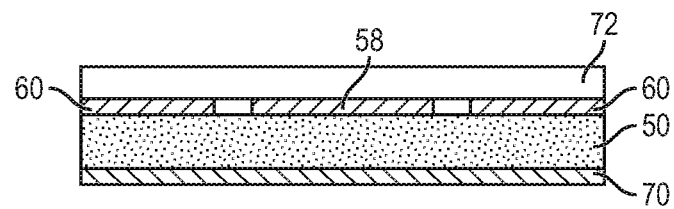
FIGS. 4a-4c illustrate electric fields between an antenna used as a proximity sensing element, surrounding shielding areas, and a human finger.

FIG. 4a is a partial cross-section of PCB 50 illustrating sensing element 58 formed on a top surface of the PCB. Optional shielding area 60 is formed on the top surface of PCB 50 around sensing element 58. An optional shielding area 70 is formed on a bottom surface of PCB 50 opposite sensing element 58 and shielding area 60. An optional overlay 72 is formed over sensing element 58 and shielding area 60 for physical isolation and protection of the sensing element and shielding area.

PCB 50 is formed from one or more layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Electronic components necessary for the functionality of mobile device 10, such as conductive traces and ICs, are formed or disposed on surfaces of PCB 50. In one embodiment, a multilayer PCB 50 is used which includes electronic components on layers between a top and bottom surface of the PCB. Components on different surfaces or at different layers of PCB 50 are connected by conductive vias formed in the PCB.

Sensing element 58 and shielding area 60 are formed as a layer of metal on PCB 50 along with conductive traces. In one embodiment, sensing element 58, shielding area 60, and traces on PCB 50 are formed from a single uniform layer of metal using subtractive methods such as silk screen printing, photoengraving, or PCB milling. In other embodiments, an additive or semi-additive method such as physical vapor deposition (PVD), chemical vapor deposition (CVD), electrolytic plating, electroless plating, or another suitable metal deposition process is used. Shielding area 70 is formed from a similar process as sensing element 58 and shielding area 60.

Sensing element 58, shielding area 60, shielding area 70, and traces on PCB 50 include one or more layers of aluminum (Al), copper (Cu), tin (Sn), nickel (Ni), gold (Au), silver (Ag), indium tin oxide (ITO), printed conductive ink, or other suitable electrically conductive material. Conductive traces are formed on the same surface of PCB 50 as sensing element 58. In other embodiments, conductive traces are formed on the surface of PCB 50 opposite sensing element 58, or on an intermediate layer when a multilayer PCB is used. Conductive vias are used to connect the various components of mobile device 10 on PCB 50 when the components and traces are on different surfaces or layers of the PCB. A conductive via connects shielding area 60 to shielding area 70 so that capacitive touch controller 56 drives both shielding areas to a similar voltage potential.

Shielding areas 60 and 70 provide a noise blocking function, as well as directionality for sensing element 58. Shielding areas 60 and 70 provide an electromagnetic shield substantially surrounding sensing element 58 in each direction other than the direction which sensing is desired. Electric fields from sensing element 58 interact with shielding areas 60 and 70, which have a stable effect on self-capacitance, instead of other objects opposite the shielding areas which have a dynamic capacitance with respect to the sensing element. Shielding areas 60 and 70 also reduce electromagnetic noise which impacts the accuracy of the detected capacitance. Even with shielding area 60, sensing element 58 receives a significant amount of interference from antenna 32.

Figure 4B:
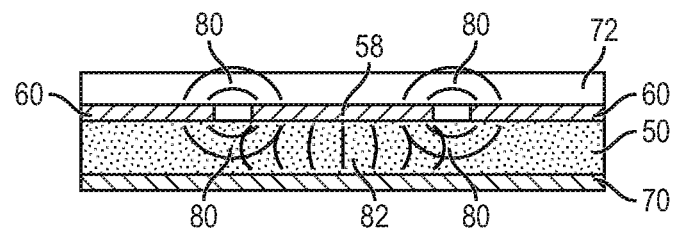
Figure 4C:
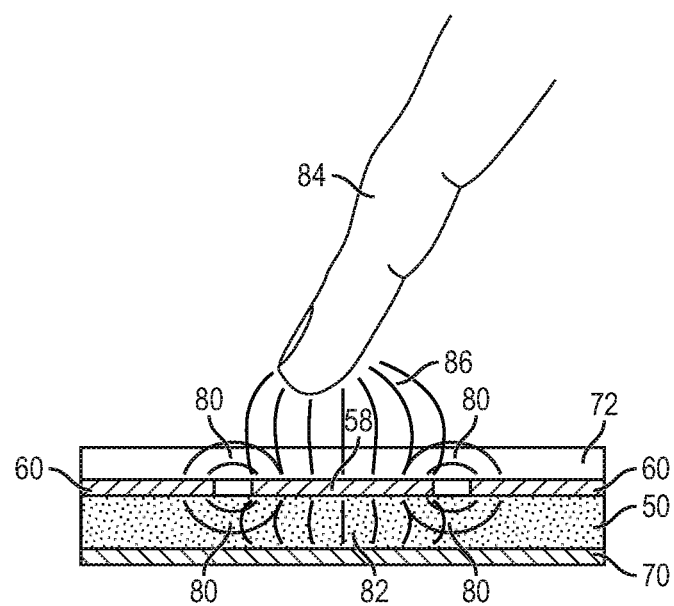

With shielding areas 60 and 70 surrounding sensing element 58 on the bottom and sides, as illustrated in FIGS. 4a-4c, a body part is detected when disposed over sensing element 58 opposite shielding area 70. Shielding area 70 limits the detection capability of capacitive touch controller 56 when a finger or other body part of user 30 is disposed on the back side of PCB 50, i.e., on the opposite side of the PCB from sensing element 58. In some embodiments with an omnidirectional antenna 32, shielding area 70 is not used so that a body part of user 30 is detected whether the body part is on a front or back side of mobile device 10. Without shielding area 70, proximity is detected, and CPU 34 reduces RF power output of mobile device 10, when a body part of user 30 is within proximity on the back side of mobile device 10, e.g., the user sets the mobile device in his or her lap. In other embodiments, neither shielding area 60 nor shielding area 70 is used.

Shielding areas 60 and 70 are electrically connected to capacitive touch controller 56. Capacitive touch controller 56 drives shielding areas 60 and 70 to a similar voltage potential as sensing element 58 when sensing self-capacitance of the sensing element. In other embodiments, shielding areas 60 and 70 are electrically connected to a ground potential. Connecting shielding areas 60 and 70 to ground potential provides an increase to the Cenv component of self-capacitance of sensing element 58 due to ground providing a source of charges attracted to the sensing element. A higher Cenv requires a larger capacitor bank within capacitive touch controller 56 to counteract the higher Cenv.

To sense self-capacitance of sensing element 58, capacitive touch controller 56 drives sensing element 58 to a direct current (DC) voltage level, or a voltage at lower frequencies than the RF signal from RF amplifier 38, and senses the amount of charge required to reach the voltage. Capacitive touch controller 56 driving shielding areas 60 and 70 to a similar voltage potential as sensing element 58 reduces self-capacitance by reducing the amount of charge the sensing element attracts in the shielding areas.

Overlay 72 provides physical isolation and protection for sensing element 58. Overlay 72 increases the robustness of mobile device 10 by protecting sensing element 58 from environmental hazards such as dust, dirt, rain, and wind. In one embodiment, overlay 72 is a sheet of plastic or glass integrated into housing 20. Overlay 72 is translucent, transparent, or opaque. Overlay 72 is formed from a material with an electric field permittivity sufficient to allow electric fields to propagate between sensing element 58 and a body part of user 30 disposed in proximity to the sensing element.

FIG. 4b illustrates electric fields between sensing element 58 and shielding areas 60 and 70 when no human body part is in the proximity of the sensing element. Electric fields 80 extend between sensing element 58 and shielding area 60. Electric fields 82 extend between sensing element 58 and shielding area 70. Electric fields 80 and 82 are simplified illustrations of the electric fields interacting with sensing element 58 and surrounding conductive material. In practice, the electric fields are complex and extend not only to shielding areas 60 and 70, but also to any conductive material, such as capacitors, inductors, ICs, conductive vias, and conductive traces near sensing element 58. In embodiments which do not use shielding areas 60 and 70, electric fields 80 and 82 do not extend to shielding areas but do extend to other surrounding conductive material, e.g., capacitors, inductors, ICs, conductive traces, and conductive vias. The environmental self-capacitance, Cenv, of sensing element 58 is a measurement of electric fields 80 and 82 from the sensing element interacting with shielding areas 60 and 70 and other conductive material in proximity to the sensing element when user 30 is not in proximity.

When a charge exists on sensing element 58, electric fields 80 and 82 attract an opposite charge within shielding areas 60 and 70 toward the sensing element. A negative charge exists when there is an excess of electrons in the atoms of an object compared to the number of protons. A positive charge exists when there is a deficit of electrons compared to the number of protons. Negatively charged material attracts positive charge, and positively charged material attracts negative charge. When a first object has a positive charge, electrons in nearby conductive objects are attracted to the first object, creating an area of negative charge in the nearby objects. When a first object has a negative charge, electrons in nearby conductive objects are repelled, creating an area of positive charge in the nearby objects. A negative charge and a positive charge are opposites.

In FIG. 4c, finger 84 of user 30 is in the proximity of sensing element 58. While a finger is illustrated, a lap, palm, face, or other conductive object is also capable of being detected. Electric fields 86 attract a charge to the tip of finger 84 that is the opposite of a charge on sensing element 58. The charge attracted in finger 84 raises the total amount of charge that must be supplied to sensing element 58 by capacitive touch controller 56 to reach a given voltage potential of the sensing element. As charge per volt is a formula defining capacitance, additional conductive material with additional charge attracted to sensing element 58 raises the self-capacitance of the sensing element. In FIG. 4c, Cenv is represented by electric fields 80 and 82, and Cuser is represented by electric fields 86. Csensor is the sum of Cenv and Cuser.

Capacitive touch controller 56 measures that the self-capacitance of sensing element 58, and thus Cuser, has risen. A flag is set within a hardware register of capacitive touch controller 56, and the capacitive touch controller asserts an interrupt signal to CPU 34. CPU 34 receives the interrupt and executes program code associated with a new proximity reading. In the case of mobile device 10, CPU 34 executes code which reduces RF power output of RF amplifier 38 to prevent exceeding SAR regulatory limit 42. In other embodiments, where capacitive sensing is used to implement buttons 14, CPU 34 executes program code associated with the pressing of a button when proximity is sensed.

Figure 5:
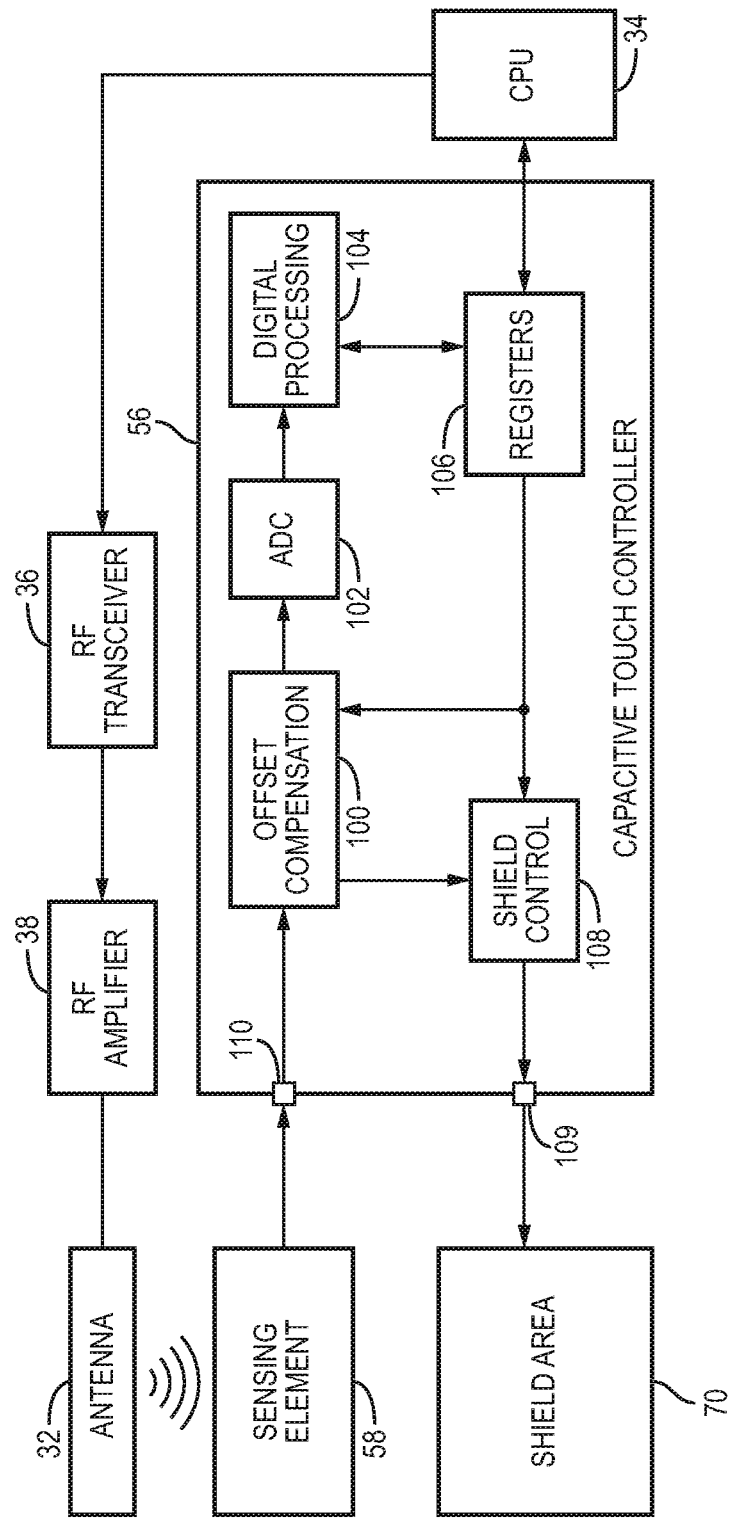
FIG. 5 illustrates the internal components of a capacitive touch controller.

FIG. 5 is a block diagram of internal components of capacitive touch controller 56. Offset compensation 100 includes a configurable bank of capacitors which are adjusted to approximately cancel the effect of Cenv so that capacitance due to the proximity of user 30, Cuser, is isolated and accurately measured. A digital value from registers 106 configures the bank of capacitors in offset compensation 100 based on a prior measurement of Cenv. The configurable capacitor bank in offset compensation 100 is used to generate a voltage approximately proportional to a previously detected Cenv. Offset compensation 100 also generates a voltage approximately proportional to Csensor, i.e., the total self-capacitance of sensing element 58. Offset compensation 100 subtracts the voltage proportional to Cenv from the voltage proportional to Csensor to produce a voltage approximately proportional to Cuser. The voltage proportional to Cuser is output from offset compensation 100 to analog-to-digital converter (ADC) 102. Cuser, Csensor, and Cenv are each different values of the capacitance of the proximity sensor formed from capacitive touch controller 56 and sensing element 58.

ADC 102 receives an analog signal from offset compensation 100 that is approximately proportional to Cuser, i.e., the portion of the self-capacitance of sensing element 58 attributable to user 30. ADC 102 converts the analog input from offset compensation 100 to a digital value approximately proportional to Cuser, and outputs the digital value to digital processing unit 104.

Digital processing unit 104 receives a digital value approximately proportional to Cuser from ADC 102 and writes the value to a hardware register in registers 106. The digital Cuser value written to a register in registers 106 is available to CPU 34 by reading the register. A different digital value, stored in a hardware register of registers 106 and configured by CPU 34, indicates a threshold Cuser must reach to report proximity. If the digital Cuser value from ADC 102 exceeds the threshold value from registers 106, digital processing unit 104 causes a proximity status flag in registers 106 to become a logic '1', and CPU 34 is interrupted for handling of the proximity event.

Digital processing unit 104 stores a digital value of Cuser in registers 106 each time the self-capacitance of sensing element 58 is converted to a new Cuser value. In one embodiment, digital processing unit 104 stores the raw Cuser value from ADC 102 in registers 106. In other embodiments, digital processing unit 104 adjusts the Cuser value before storage in registers 106, e.g., by adjusting Cuser for drift of Cenv or by filtering high frequency noise.

Registers 106 contain various memory mapped hardware registers used by CPU 34 to configure capacitive touch controller 56, or by the capacitive touch controller to report proximity and other information to the CPU. Some hardware registers of registers 106 are set by a manufacturer for configuration aspects which the manufacturer desires to set permanently for the lifetime of mobile device 10, or until modified by a manufacturer's update. Registers 106 include interrupt request (IRQ) bits used to notify CPU 34 when the proximity status of user 30 has changed, i.e., the user has entered or left the proximity of sensing element 58. Registers 106 also include IRQ bits for completion of a new reading of Cuser or a new calibration of Cenv. Registers 106 are used by CPU 34 to set a threshold value of Cuser when proximity is considered detected, to reset capacitive touch controller 56, and to set a frequency at which periodic capacitance readings are to occur, among other uses.

Registers 106 include read-only registers set by a manufacturer of mobile device 10. One read-only register is used to store a reference Cenv reading, which the manufacturer calculates with mobile device 10 in a known state. The reference Cenv reading is used to verify subsequent Cenv readings were validly made without user 30 in proximity, and is also used to detect proximity when no other value of Cenv is available. Another read-only register in registers 106 is used to store a temperature coefficient of the self-capacitance of sensing element 58. The self-capacitance of sensing element 58 has an approximately linear relationship with the temperature of mobile device 10. A coefficient defining the relationship between the self-capacitance of sensing element 58 and the temperature of mobile device 10 is stored in registers 106 for use by digital processing unit 104 to accurately adjust Cuser readings to account for temperature changes.

Shield control 108 drives shielding areas 60 and 70, when used, to a similar voltage potential as offset compensation 100 drives sensing element 58. Driving shielding areas 60 and 70 to a similar voltage potential as sensing element 58 reduces the effect of the shielding areas on the self-capacitance of the antenna. The functionality of shield control 108 driving shielding areas 60 and 70 to a similar voltage as sensing element 58 can be enabled and disabled by CPU 34 using a hardware register in registers 106. Shield control 108 is electrically connected to shielding areas 60 and 70 via shield pin or node 109 on capacitive touch controller 56.

Capacitive touch controller 56 is electrically connected to sensing element 58 via capacitive sensing pin or node 110. In some embodiments, multiple sensor elements are connected to capacitive touch controller 56 via multiple input pins. Multiple sensor elements are used to improve the accuracy of proximity sensing, or to sense proximity at multiple locations on mobile device 10.

CPU 34 communicates over cellular and other networks through RF transceiver 36, RF amplifier 38, and antenna 32. RF amplifier 38 is electrically connected to antenna 32. RF amplifier 38 generates an RF signal which travels to antenna 32 and is broadcast out as electromagnetic radiation. Sensing element 58 is in the physical proximity of antenna 32. Electromagnetic radiation from antenna 32 travels through sensing element 58 and creates a force on electrons in the sensing element. The electrons in sensing element 58 oscillate with the force from antenna 32, creating an oscillating electric current. The oscillating RF current which sensing element 58 receives from antenna 32 enters capacitive touch controller 56 via sensing pin 110. RF energy reaches offset compensation 100 and causes errors in the measured self-capacitance of sensing element 58.

Figure 6:
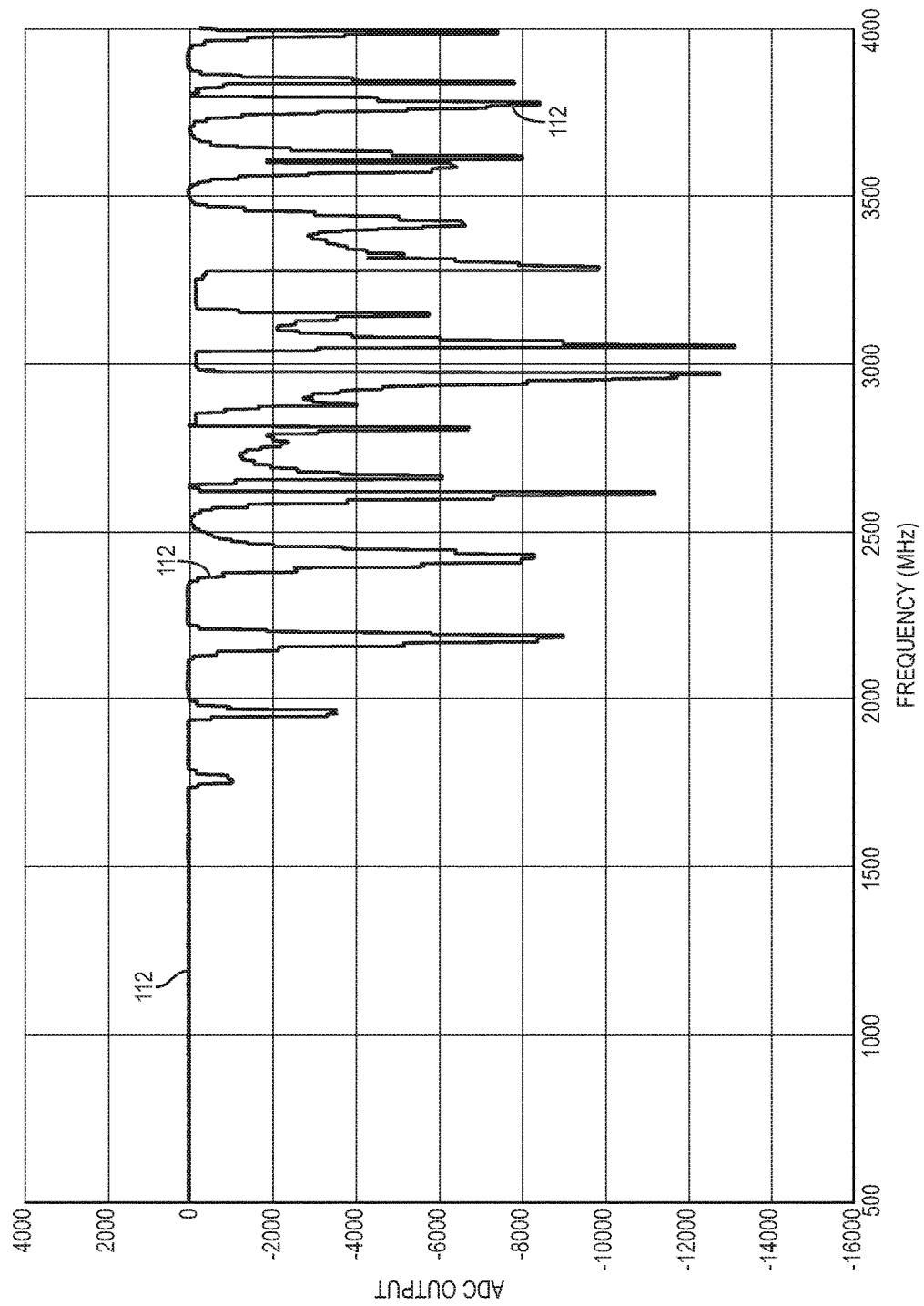
FIG. 6 illustrates interference of a capacitive touch controller caused by an RF signal.

FIG. 6 illustrates error in proximity readings by capacitive touch controller 56 caused by RF signals from antenna 32 received by sensing element 58. FIG. 6 is a graph with the frequency of a signal from RF amplifier 38 on the horizontal axis. The graph of FIG. 6 shows the digital output of ADC 102 on the vertical axis. Function 112 illustrates, for one embodiment, the error observed in the digital output of ADC 102 for a frequency range of RF amplifier 38 from 500 megahertz (MHz) to 4 gigahertz (GHz). 500 MHz through 4 GHz approximately corresponds to the full LTE spectrum, which is a common technology used by cell phones to communicate.

Function 112 is plotted by connecting an RF function generator to RF amplifier 38. The function generator provides RF amplifier 38 with an unmodulated RF carrier signal which sweeps from a low end frequency of 500 MHz to a high frequency of 4 GHz, and provides for an output power of the RF amplifier which is 2 watts (W), or 33 decibel-milliwatts (dBm). The function generator sweeps from low to high by taking a series of frequency steps, with each step being at a higher frequency than the previous step. At each frequency step of the function generator, capacitive touch controller 56 measures the capacitance of sensing element 58, and the output of ADC 102 is recorded from registers 106. The data points of frequency versus ADC 102 output are plotted on a graph as function 112. Function 112 is a function of ADC 102 output error over a range of frequencies.

Function 112 illustrates that RF interference has a significant impact on capacitance sensing. The RF energy flowing into capacitive touch controller 56 reduces the value of capacitance sensed, and thus requires a body part of user 30 within proximity of sensing element 58 to raise self-capacitance by at least the plotted error for a given frequency to be detected. In other embodiments, RF energy received by capacitive touch controller 56 raises the output of ADC 102 and causes a proximity reading when user 30 is not in proximity.

In one embodiment, a change of 4000 in the output of ADC 102, illustrated on the Y axis in FIG. 6, corresponds to approximately a 1 pF change in the self-capacitance of sensing element 58. Function 112 shows that for some frequencies, the error caused by an RF signal from antenna 32 is over 3 pF. In one embodiment, the capacitance threshold change to detect proximity is 0.01 pF. For much of the LTE spectrum, the error caused by RF energy is greater than the threshold capacitance to be detected, creating difficulty in detection of user 30.

In addition, the protocols used for RF communication via antenna 32 include constraints which make it difficult to time-multiplex the use of the antenna to broadcast RF signals and capacitive measurements using capacitive touch controller 56 and sensing element 58. Time-multiplexing would allow capacitance readings of sensing element 58 to only occur when antenna 32 was not broadcasting an RF signal, reducing the interference caused in capacitive touch controller 56. When time-multiplexing is not possible, RF amplifier 38 broadcasts using antenna 32 at the same time as capacitive touch controller 56 performs a proximity reading.

FIGS. 7*a*-7*d* illustrate capacitive touch controller 56 with the addition of an integrated RF blocker stage.

Figure 7A:
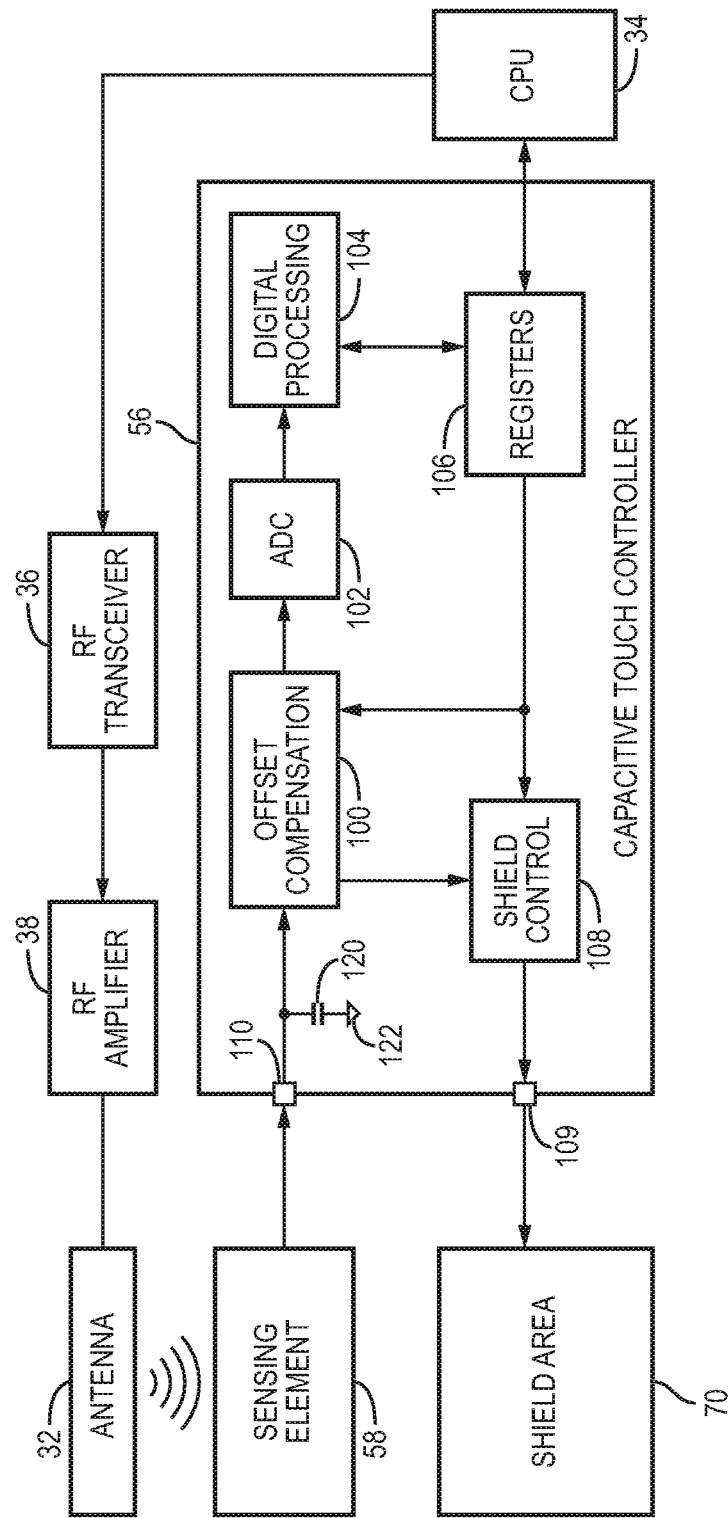
FIGS. 7a-7d illustrate a capacitive touch controller with an integrated RF blocker stage.

FIG. 7*a* shows capacitor 120, an integrated passive device (IPD) formed on the semiconductor die of capacitive touch controller 56. In other embodiments, capacitor 120 is a discrete component packaged together with capacitive touch controller 56, or a separate component mounted on PCB 50. Capacitor 120 is coupled between capacitive sensing pin 110 of capacitive touch controller 56 and ground node 122 to shunt RF signals to the ground node. RF signals broadcast using antenna 32 are received by sensing element 58 and enter capacitive touch controller 56. Capacitor 120 provides a direct shunt capacitance to evacuate RF energy to ground node 122 before the RF energy enters offset compensation 100.

Capacitor 120 approximates a short circuit for frequencies in the RF range. Capacitor 120 acts as a connection to ground node 122 for RF energy from RF amplifier 38 which enters capacitive touch controller 56 because of RF coupling between antenna 32 and sensing element 58. With RF energy entering capacitive touch controller 56 coupled to ground node 122 using capacitor 120, the amount of RF energy entering offset compensation 100 is reduced. Proximity readings are more accurate because reducing RF energy entering offset compensation 100 reduces the interference with measurements caused by the RF signals.

Capacitor 120 approximates an open circuit for lower frequencies in the range used by capacitive touch controller 56 to sense the self-capacitance of sensing element 58. Capacitor 120 does not provide a significant connection to ground for the low frequency signals used for sensing self-capacitance. The signals used by capacitive touch controller 56 to sense self-capacitance of sensing element 58 are not significantly affected by capacitor 120, and flow between the sensing element and offset compensation 100. Capacitor 120 shunts high frequency RF signals received from antenna 32 to ground node 122 while having a negligible effect on the signals used by offset compensation 100 to sense the self-capacitance of sensing element 58.

CPU 34 communicates over cellular and other networks through RF transceiver 36, RF amplifier 38, and antenna 32. When broadcasting an RF signal, RF amplifier 38 outputs the RF signal to antenna 32. Antenna 32 receives the RF signal from RF amplifier 38 and generates an electromagnetic wave emanating from the antenna. The electromagnetic wave travels through sensing element 58 and generates an electric current in the sensing element. A significant amount of RF energy from antenna 32 reaches capacitive touch controller 56. RF signals which enter capacitive touch controller 56 are shunted to ground node 122 via capacitor 120. Capacitor 120 has a low electrical impedance for RF signals, and provides a path to ground node 122 for RF energy at a significantly lower impedance than the path into offset compensation 100. Accordingly, RF energy entering capacitive touch controller 56 via capacitive sensing pin 110 is shunted to ground node 122, reducing the amount of RF energy entering offset compensation 100.

Capacitor 120 effectively reduces the interference caused by RF signals from RF amplifier 38, but also increases the total capacitance between ground node 122 and sensing element 58. Capacitance between ground potential and sensing element 58 is what is measured by capacitive touch controller 56 to determine proximity, so adding a capacitor between ground node 122 and the sensing element directly increases the Cenv component of self-capacitance. The larger the value of a capacitor used for capacitor 120, the greater Cenv becomes. A higher Cenv value requires a larger capacitor bank in offset compensation 100 to cancel or counteract Cenv, potentially increasing the physical size requirement of the capacitor bank on the semiconductor die of capacitive touch controller 56.

Figure 7B:
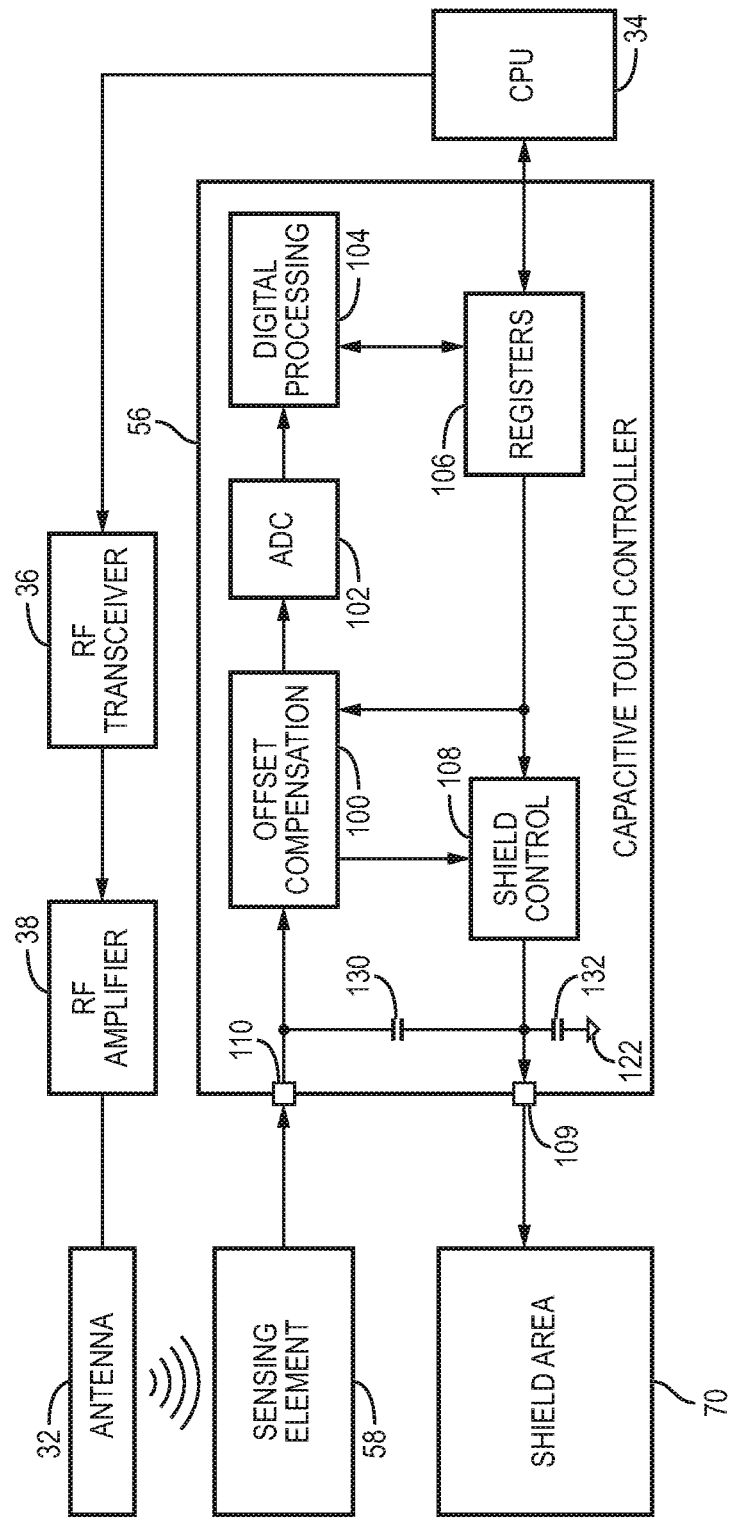

FIG. 7b illustrates an RF blocker stage with capacitor 130 and capacitor 132 providing an indirect shunt of RF signals to ground node 122. Capacitors 130 and 132 are IPDs formed on the semiconductor die of capacitive touch controller 56. In other embodiments, capacitors 130 and 132 are discrete components packaged with capacitive touch controller, or separate components mounted or formed on PCB 50. Capacitor 130 is coupled between capacitive sensing pin 110 and shield pin 109. Capacitor 132 is coupled between shield pin 109 and ground node 122. RF signals which enter capacitive touch controller 56 through capacitive sensing pin 110 are shunted to ground node 122 through capacitors 130 and 132, reducing the strength of the RF signal entering offset compensation 100.

Capacitors 130 and 132 approximate short circuits for frequencies in the RF range. Capacitor 130 provides a path for RF signals between capacitive sensing pin 110 and shield pin 109. Capacitor 130 completes the path for RF signals to ground node 122 by coupling between shield pin 109 and the ground node. The path to ground node 122 which capacitors 130 and 132 provide for RF signals is indirect because the output of shield control 108 provides an intermediate node between capacitive sensing pin 110 and the ground node. RF energy received by sensing element 58 because of coupling with antenna 32 flows through capacitor 130 to shield pin 109, then through capacitor 132 to ground node 122. With RF signals entering capacitive touch controller 56 coupled to ground node 122 using capacitors 130 and 132, the amount of RF energy entering offset compensation 100 is reduced. Proximity readings are more accurate because reducing RF energy entering offset compensation 100 reduces the interference with measurements caused by the RF signals.

Capacitors 130 and 132 approximate an open circuit for lower frequencies in the range used by capacitive touch controller 56 to sense the self-capacitance of sensing element 58. Capacitors 130 and 132 do not provide a significant connection to ground node 122 for the signals used to sense self-capacitance of sensing element 58. The normal operation of capacitive touch controller 56 is not significantly impacted by capacitors 130 and 132. Capacitors 130 and 132 shunt RF signals to ground node 122 while having less of an effect on the signals used by offset compensation 100 to sense the self-capacitance of sensing element 58.

An indirect connection of capacitive sensing pin 110 to ground node 122 reduces the effect on self-capacitance of sensing element 58 compared to directly shunting the capacitive sensing pin to the ground node. With capacitor 120 directly shunting capacitive sensing pin 110 to ground node 122, as shown in FIG. 7a, the measured self-capacitance of sensing element 58 is directly affected. Capacitor 120 adds capacitance between capacitive sensing pin 110 and ground node 122, which is the capacitance measured to determine self-capacitance of sensing element 58. However, capacitor 130 coupled between capacitive sensing pin 110 and shield pin 109 does not significantly increase self-capacitance of sensing element 58 because shield control 108 drives shield pin 109 to a voltage which is approximately equal to the voltage at capacitive sensing pin 110. Driving shield pin 109 and capacitive sensing pin 110 to approximately the same voltage reduces the impact of capacitance added between the shield pin and capacitive sensing pin on the environmental capacitance measured by offset compensation 100. Because capacitors 130 and 132 provide less of an increase in environmental capacitance measured by capacitive touch controller 56 than the increase caused by capacitor 120, the capacitance values of capacitors 130 and 132 are greater than the capacitance value of capacitor 120. Larger capacitance values increase the effectiveness of capacitors 130 and 132 as short circuits for RF signals to ground node 122.

CPU 34 communicates over cellular and other networks through RF transceiver 36, RF amplifier 38, and antenna 32. When broadcasting an RF signal via antenna 32, RF amplifier 38 outputs the RF signal to antenna 32. Antenna 32 receives the RF signal from RF amplifier 38 and generates electromagnetic radiation emanating from the antenna. Sensing element 58 receives the radio waves from antenna 32 and an RF signal is generated in the sensing element which reaches capacitive touch controller 56. RF signals which enter capacitive touch controller 56 are shunted to ground node 122 via capacitors 130 and 132. Capacitors 130 and 132 have a low electrical impedance for RF signals. Capacitors 130 and 132 provide a path to ground node 122 for RF signals at a significantly lower impedance than the path into offset compensation 100. Accordingly, RF energy entering capacitive touch controller 56 via capacitive sensing pin 110 is substantially shunted to ground node 122 while the amount of RF energy entering offset compensation 100 is reduced.

Capacitors 130 and 132 effectively reduce the interference caused by RF signals from RF amplifier 38 without a significant increase in the measured self-capacitance of sensing element 58. Capacitance between capacitive sensing pin 110 and ground node 122 is not significantly increased by capacitors 130 and 132 due to shield pin 109 providing an intermediate node driven to approximately the same voltage as capacitive sensing pin 110. Capacitors 130 and 132 do not require a larger capacitor bank in offset compensation 100 because capacitors 130 and 132 do not significantly increase Cenv.

Capacitor 132 increases the capacitance between shield pin 109 and ground node 122. However, shield pin 109 is driven by a buffer in shield control 108, which isolates the shield pin from capacitive sensing pin 110. The capacitance between shield pin 109 and ground node 122 does not significantly impact the operation of offset compensation 100. Capacitance between shield pin 109 and ground node 122 is not cancelled by a capacitor bank within capacitive touch controller 56 which would need to be larger to compensate for capacitor 132.

Figure 7C:
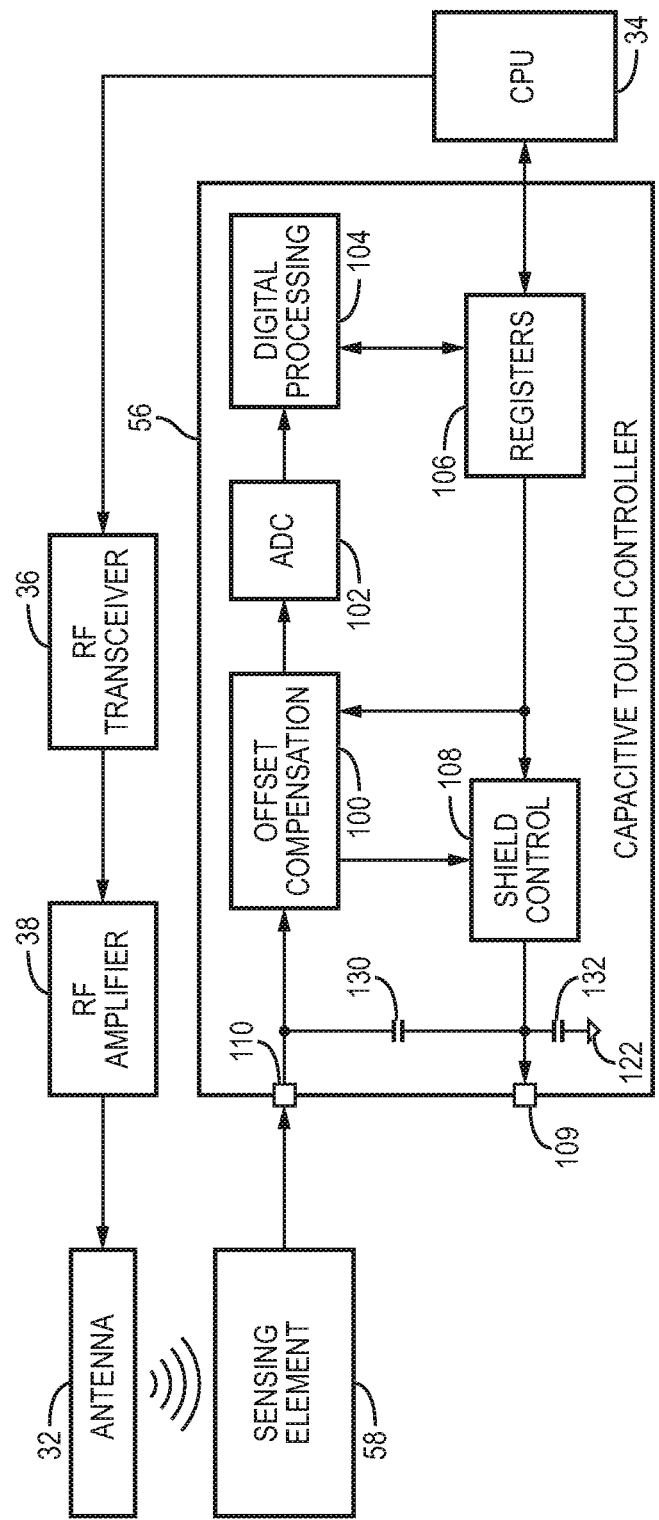

FIG. 7c illustrates an embodiment without the use of shielding areas. Without shielding area 70, the self-capacitance of sensing element 58 is affected by a body part in proximity on the back side of mobile device 10 as well as the front side. Without shielding areas being used, an output of shield control 108 still provides an intermediate node between capacitors 130 and 132 which is driven to a similar voltage as sensing element 58. In some embodiments, shield control 108 is not used. An intermediate node is provided using a unity gain buffer amplifier or other method to isolate the intermediate node from sensing element 58 while driving the circuit node to a similar voltage as the sensing element.

Figure 7D:
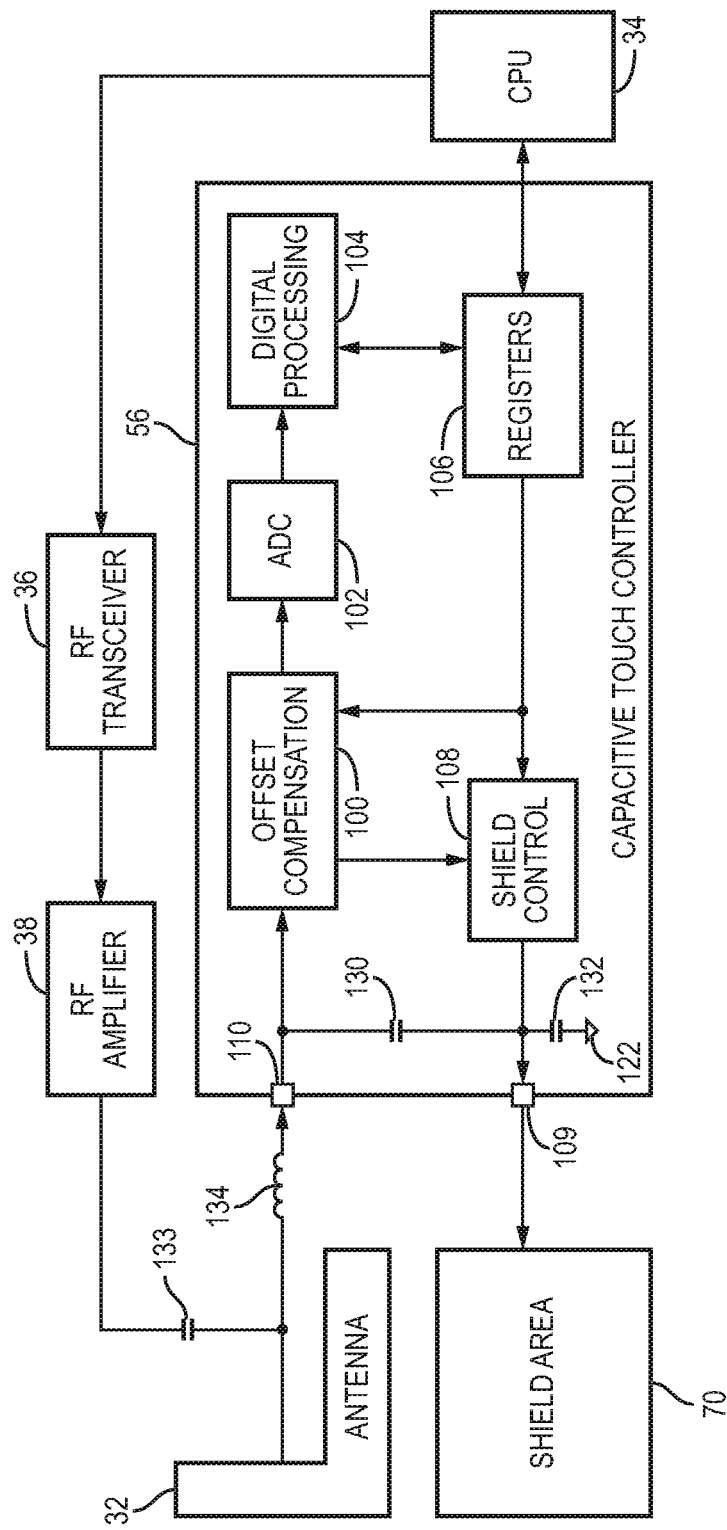

FIG. 7d illustrates an embodiment in which the same physical element is used as an RF antenna and as a sensing element. Inductor 134 is coupled between capacitive sensing pin 110 and antenna 32. Inductor 134 reduces the magnitude of RF signals from RF amplifier 38 while having a negligible effect on the lower frequency signals from capacitive touch controller 56 used to measure self-capacitance of antenna 32. RF amplifier 38 is electrically connected to antenna 32 via capacitor 133. Capacitor 133 isolates RF amplifier 38 from a DC voltage offset of antenna 32, and reduces the magnitude of lower frequency signals used to detect self-capacitance of the antenna. Capacitor 133 allows the higher frequency RF signal from RF amplifier 38 to pass to antenna 32 for transmission into the surrounding atmosphere. In one embodiment, capacitor 133 is a 22 picofarad (pF) capacitor, and inductor 134 is a 180 nanohenry (nH) inductor.

RF amplifier 38 and capacitive touch controller 56 are both electrically connected to antenna 32. Without capacitor 133 and inductor 134, the output of RF amplifier 38 and capacitive sensing pin 110 are short circuited together by traces on PCB 50. The output of RF amplifier 38 is driven to a DC voltage, or driven to a voltage changing at a lower frequency than the output of the RF amplifier, by capacitive touch controller 56. Driving the output of RF amplifier 38 to a DC or low frequency voltage interferes with the output circuitry of the RF amplifier, which reduces signal strength or causes undesired modification of the output signal from the RF amplifier. Driving the output of RF amplifier 38 with the output of capacitive touch controller 56 causes damage to the RF amplifier circuitry.

Without inductor 134, the RF signal from RF amplifier 38 flows into capacitive touch controller 56 without attenuation, resulting in inaccurate readings of the proximity of user 30. Even with the attenuation of RF signals provided by inductor 134, the RF energy is not completely eliminated. A significant amount of RF energy is received by capacitive touch controller 56, causing inaccurate readings of proximity.

Figure 8:
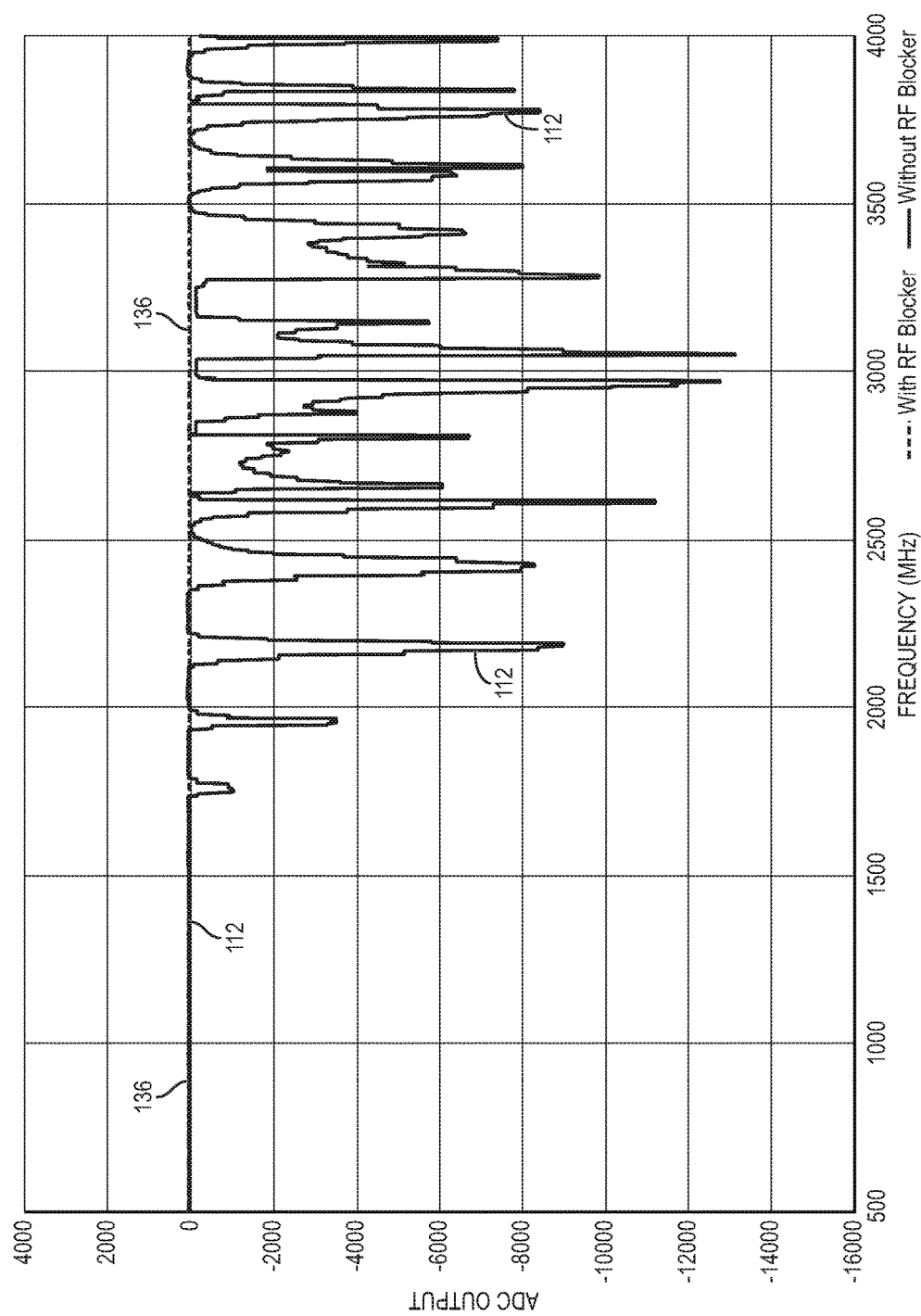
FIG. 8 illustrates a reduction in interference of a capacitive touch controller by using an RF blocker stage.

FIG. 8 illustrates error observed at the digital output of ADC 102 with and without an RF blocker stage shunting RF energy on capacitive sensing pin 110 to ground node 122. Function 112 demonstrates error seen without an RF blocker stage for RF signals between 500 MHz and 4 GHz. Without an RF blocker stage, the impact of RF energy from RF amplifier 38 can be equivalent to an error of over 3 pF. Function 136 illustrates the digital output of ADC 102 over the frequency range of 500 MHz through 4 GHz when using either capacitor 120 of FIG. 7a or capacitors 130 and 132 of FIGS. 7b-7d as an RF blocker stage. Function 136 shows that the error in capacitance readings from RF energy is significantly reduced by using an RF blocker stage.

The RF output power used for driving antenna 32 can be up to 2 W (33 dBm), while capacitive measurements of capacitive touch controller 56 detect much smaller changes in energy levels. Due to cellular network protocol restraints, time-multiplexing the RF and capacitive sensing operations is difficult. Therefore, transmissions at high power and a wide range of frequencies occur at the same time as capacitive sensing measurements by capacitive touch controller 56. The RF energy entering capacitive touch controller 56 corrupts capacitance measurements. An RF blocker stage integrated into capacitive touch controller 56, formed using capacitor 120 or capacitors 130 and 132, shunts RF signals to ground potential and prevents significant RF power from entering offset compensation 100 to corrupt the capacitive sensing measurement. Capacitor 120 provides a direct shunt to ground for RF signals, while capacitors 130 and 132 provide an indirect shunt to ground. Capacitor 120 has a lower value than capacitors 130 and 132 because capacitor 120 directly affects the capacitance on capacitive sensing pin 110. The output of shield control 108 provides an intermediate node between capacitive sensing pin 110 and ground node 122 which reduces the impact of capacitors 130 and 132 on the capacitance of capacitive sensing pin 110.

Capacitive touch controller 56 including an integrated RF blocker stage results in an input to offset compensation 100 which is nearly ideal, with no significant error observed across the LTE spectrum. Reducing errors in proximity sensing allows accurate proximity detection of user 30. Accurate proximity detection allows RF output of RF amplifier 38 to be reduced properly when mobile device 10 is within proximity of a user, preventing violation of SAR regulations. Accurate proximity detection also allows RF power to be increased properly when mobile device 10 is moved away from user 30, improving connectivity of the mobile device with cell phone towers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor package, comprising:
   providing a shield pin as an output pin of the semiconductor package;
   providing a sensing pin as an input pin of the semiconductor package;
   providing a semiconductor die within the semiconductor package comprising a capacitive touch controller circuit including an output of the capacitive touch controller circuit coupled to the shield pin and an input of the capacitive touch controller circuit coupled to the sensing pin; and
   providing a capacitor within the semiconductor package including a first terminal of the capacitor coupled to the sensing pin and a second terminal of the capacitor coupled to a ground circuit node.

2. The method of claim 1, further including forming the capacitor as an integrated passive device over the semiconductor die.

3. The method of claim 1, further including providing a buffer comprising an input of the buffer coupled to the sensing pin and an output of the buffer coupled to the shield pin.

4. The method of claim 1, further including configuring the capacitive touch controller circuit to measure a capacitance of the sensing pin.

5. The method of claim 4, further including providing a digital processing unit configured to compare the capacitance of the sensing pin to a threshold capacitance.

6. The method of claim 1, wherein the capacitor is a discrete component packaged together with the semiconductor die.

7. The method of claim 1, further including a second capacitor coupled between the sensing pin and ground circuit node in series with the capacitor.

8. The method of claim 1, further including:
   mounting the semiconductor package on a substrate;
   forming a sensing element on the substrate; and
   electrically coupling the sensing element to the capacitor through the sensing pin of the semiconductor package.

9. The method of claim 8, further including forming an antenna on the substrate separate from the sensing element.

10. A semiconductor device, comprising:

a substrate;

a semiconductor package disposed over the substrate and including a shield pin and a sensing pin;

a capacitive touch controller within the semiconductor package including an output of the capacitive touch controller coupled to the shield pin and an input of the capacitive touch controller coupled to the sensing pin;

a capacitor within the semiconductor package including a first terminal of the capacitor coupled to the sensing pin and a second terminal of the capacitor coupled to a ground circuit node;

a sensing element disposed over the substrate and coupled to the sensing pin of the semiconductor package; and an antenna disposed over the substrate separate from the sensing element.

11. The semiconductor package of claim 10, wherein the capacitive touch controller is formed in a semiconductor die and the capacitor is formed as an integrated passive device over the semiconductor die.

12. The semiconductor package of claim 10, wherein the capacitive touch controller is formed in a semiconductor die and the capacitor is a discrete component packaged together with the semiconductor die.

13. The semiconductor package of claim 10, further including a buffer comprising an input of the buffer coupled to the sensing pin and an output of the buffer coupled to the shield pin.

14. The semiconductor package of claim 10, wherein the capacitive touch controller is configured to measure a capacitance of the sensing pin.

15. The semiconductor package of claim 14, further including a digital processing unit configured to compare the capacitance of the sensing pin to a threshold capacitance.

* * * * *